United States Patent [19]
Lacroix et al.

[11] Patent Number: 5,448,189
[45] Date of Patent: Sep. 5, 1995

[54] SIGNAL AVERAGING APPARATUS

[75] Inventors: Daniel P. Lacroix, Westford; Neal R. Butler, Acton; Frank B. Jaworski, Boxborough, all of Mass.

[73] Assignee: Loral Infrared & Imaging Systems, Inc., Lexington, Mass.

[21] Appl. No.: 240,077

[22] Filed: May 9, 1994

Related U.S. Application Data

[63] Continuation of Ser. No. 867,122, Apr. 10, 1992, abandoned.

[51] Int. Cl.⁶ .................. G11C 27/02; G01R 19/00
[52] U.S. Cl. .......................................... 327/91; 327/58
[58] Field of Search ................ 307/351, 352, 353; 328/151; 327/58, 62, 91, 93, 94, 142, 198, 365

[56] References Cited

U.S. PATENT DOCUMENTS

| | | | |
|---|---|---|---|
| 3,555,298 | 1/1971 | Neelands | 307/353 |
| 4,075,513 | 2/1978 | Hinckley, Jr. | 307/351 |
| 4,808,822 | 2/1989 | Manning et al. | 250/208.1 |
| 5,162,670 | 11/1992 | Itakura et al. | 307/353 |
| 5,315,168 | 5/1994 | Norton, Jr. | 307/352 |

FOREIGN PATENT DOCUMENTS 0050394  3/1982  Japan .................. 307/353

OTHER PUBLICATIONS

Scribner et al., "Infrared Focal Plane Array Technology," Proceedigns of the IEEE, vol. 79, No. 1, Jan. 1991, pp. 66-85.
Bluzer et al., "Current readout of infrared detectors" Optical Engineering, Mar. 1987, vol. 26, No. 3, pp. 241-248.
Wilson, "Peak Detecting Circuit," IBM Technical Disclosure Bulletin, vol. 6, No. 10, Mar. 1964, pp. 92-93.
P. Watkinson et al, "A fast multichannel signal recorder and averager" Journal of Physics E: Scientific Instruments 1976 vol. 9 pp. 776-778.

*Primary Examiner*—Timothy P. Callahan
*Assistant Examiner*—Toan Tran
*Attorney, Agent, or Firm*—Leone & Moffa

[57] ABSTRACT

An analog signal processing circuit used to suppress unipolar transient effects and signal averaging. Two transistors and one capacitor are provided in series to sample and condition an input signal. An additional transistor is provided in parallel to the capacitor to provide further signal processing capabilities. The circuit can function as an analog signal average, suppressing unipolar transient effects and as a peak detector while using a conservative amount of fabrication material and can be operated with low power.

3 Claims, 7 Drawing Sheets

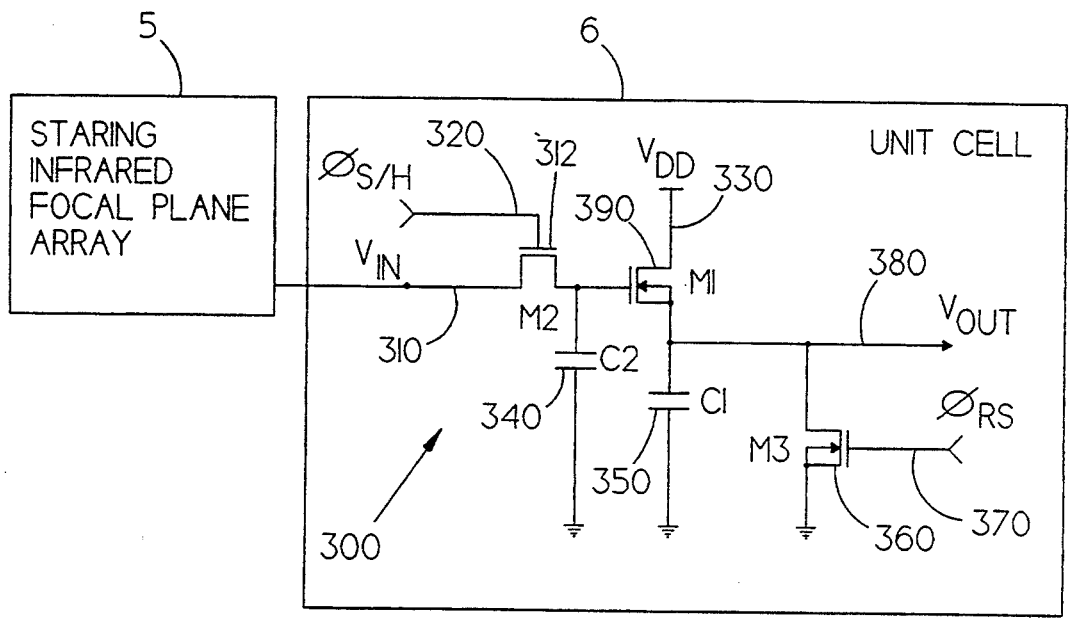
Fig_6
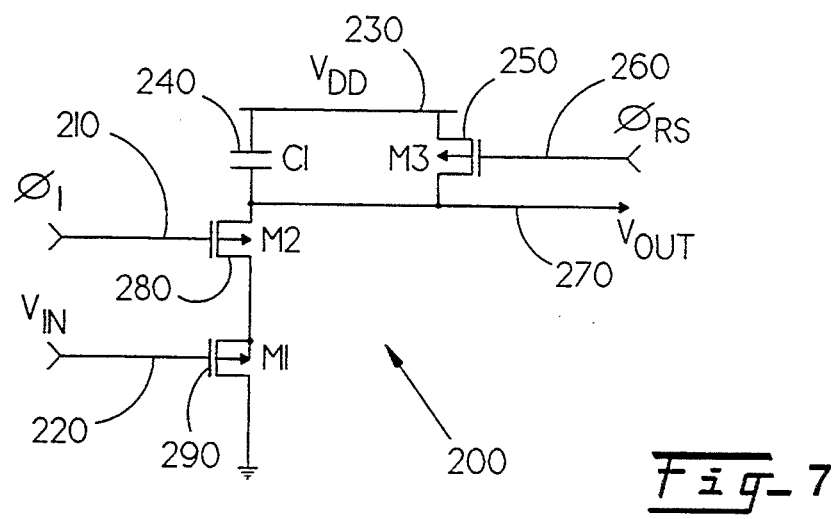
Fig_7

5,448,189

SIGNAL AVERAGING APPARATUS

GOVERNMENT LICENSE RIGHTS

This invention was made with government support and the U.S. Government has certain rights in this invention and may have the right in limited circumstances to require the patent owner to license others a reasonable terms as provided for by the terms of Subcontract SK70A0430M awarded by the Department of Defense.

This is a continuation of application Ser. No. 07/867,122, filed on Apr. 10, 1992 now abandoned.

This invention relates to a signal processing circuit and, more particularly, a signal processing circuit used for signal averaging and suppression of unipolar transient effects.

BACKGROUND OF THE INVENTION

The analog circuits embodied in semiconductor material are typically used for computation or sampling. When used for sampling, a number of undesirable effects are often seen, including gamma or unipolar transient effects. Typically such analog circuits are used as averagers or integraters where the incoming signal is sampled over a period of time. Analog sampling circuits responding as peak detectors often suffer from noise associated with signals which are corrupted with negative polarity gamma or other unipolar transient voltage shifts.

The prior art analog signal processing circuits could not perform the dual tasks of analog signal averaging and gamma suppression, also known as transient suppression. Prior art circuits have employed averaging techniques that require a substantial number of components. A prior art signal averager designed for 64 averages would require approximately 50 times the area of the present invention. The prior art's need for capacitors dictates large area usage. Also prior art signal averaging circuits are limited in the number of averages attained due to dynamic range considerations.

The circuit of the invention responds to small signals and works as a peak detector. The circuit of the invention differs from prior art peak detectors because it averages small signals.

It is therefore the motivation of the invention to provide a peak detector that averages small signals and requires small amounts of silicon real estate.

SUMMARY OF THE INVENTION

The invention provides a signal processing circuit that can be used for analog averaging or the suppression of gamma or other undesirable unipolar transient effects of analog signals. By employing a switching transistor, a signal can be sampled for a specified time. Signal current is sent to an integrating capacitor. The output of the invention increases the total source potential of an input transistor to a predetermined threshold value. The invention provides different effects depending on the behavior of the input transistor. The input signal can be sampled a number of times providing a final output after the predetermined time period. The final output voltage will be representative of the average of the signal samples taken. The circuit can be reset.

One object of the invention is to provide an improved analog processing circuit that performs analog signal averaging.

It is another object of the invention to provide an improved signal processing circuit useful for suppression of unipolar transient effects of analog signals.

It is yet another object of the invention to provide an improved circuit that requires fewer and smaller components.

It is yet another object of the invention to provide an improved signal processing circuit that can be realizable in a smaller silicon area.

It is yet another object of the invention to provide an improved signal processing circuit that does analog signal averaging and can be realized in a compact size.

It is a further object of the invention to provide an improved signal processing circuit having gamma suppression capabilities in staring infrared focal planes.

It is yet another object of the invention to provide an improved signal processing circuit that requires less power.

It is a further object of the invention to provide an improved circuit that performs as a peak detector.

It is yet a further object of the invention to provide an improved circuit that averages to small signals.

It is a further object of the invention to provide an improved long wave length infrared focal plane array signal processing circuit.

Other objects, features and advantages of the present invention will become apparent to those skilled in the art through the description of the preferred embodiment, claims and drawings herein where like numerals refer to like elements.

BRIEF DESCRIPTION OF THE DRAWINGS

To illustrate the invention, a preferred embodiment of this invention will be described hereinafter with reference to the accompanying drawings. The preferred embodiment concerns a signal processing circuit to perform signal averaging and suppression of unipolar transient effects.

FIG. 6 is another alternative embodiment of the invention utilizing a sample and hold.

FIG. 7 is a schematic drawing of one alternative of the embodiment of the invention using complementary circuit inversion.

DESCRIPTION OF THE PREFERRED EMBODIMENT

Figure 1:
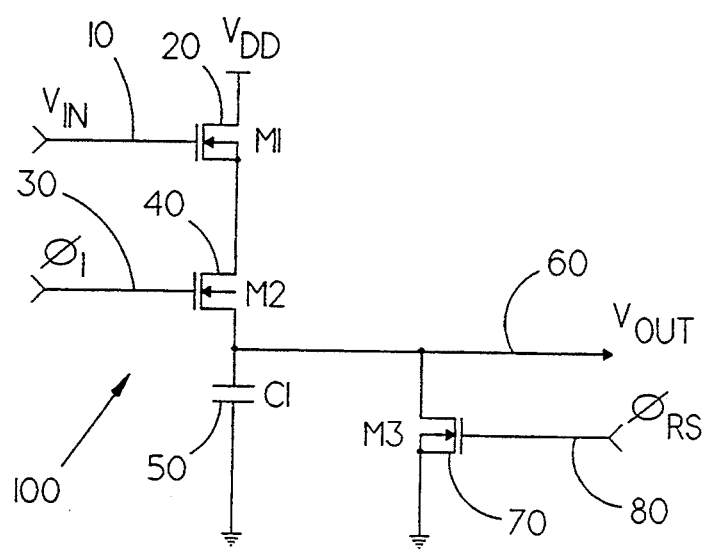
FIG. 1 is a circuit diagram of one embodiment of the method of the invention.

FIG. 1 shows a schematic representation of one embodiment of the signal processing circuit 100 of the invention. A first electrical signal $V_{IN}$ 10 is connected to the gate of field effect transistor 20. A second electrical signal $V_{DD}$ is connected to the drain of field effect transistor 20. The source of transistor M1 20 is connected in series to the drain of a second transistor M2 40. The gate of transistor M2 40 is attached to a third electrical signal, input signal 30 $\phi_1$. The source of transistor M2 40 is connected to one side of C1 capacitor 50. The other side of capacitor C1 50 is grounded. A third transistor M3 70 has a source which is grounded. The gate of the third transistor M3 70 is attached to input signal $\phi_{RS}$ 80 and the drain of transistor M3 70 is further attached to $V_{OUT}$ which is also attached to the transistor M2 40 side of capacitor C1 50.

Figure 2:
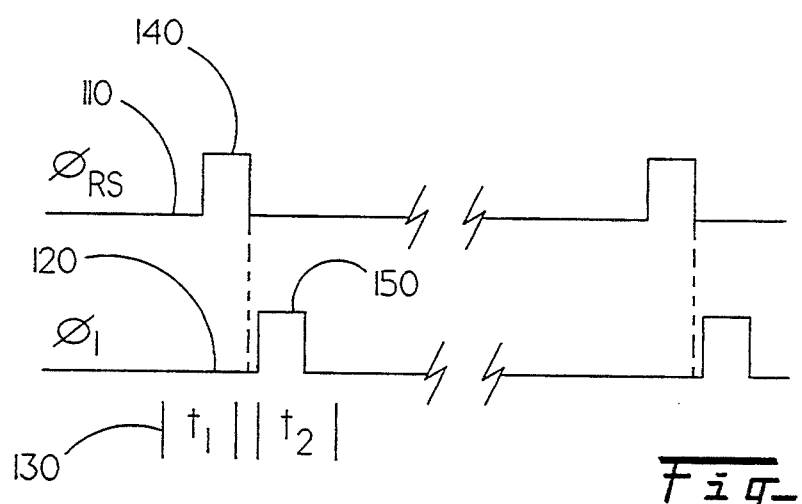
FIG. 2 is a graph of the operating voltages of the circuit of the invention.

Now referring to FIG. 2 which shows the control signals used to operate the circuit of FIG. 1. $\phi_{RS}$ 80 is driven following the voltage curve $\phi_{RS}$ reset 110. $\phi_{RS}$ reset 110 provides the signal used to reset the sampling circuit 100. $\phi_1$ 30 is driven following the voltage curve $\phi_1$ sample 120. $\phi_1$ sample 120 provides the signal used to sample the input $V_{IN}$ 10.

Circuit 100 will now be explained as to its operation in the preferred embodiment of the invention with reference to FIGS. 1 and 2. The first electrical signal $V_{IN}$ 10 is a constant signal with guassian noise distribution. The circuit can be initialized by discharging capacitor C1 50 to ground through transistor M3 70, line $\phi_{RS}$ provides the control. Transistor M3 70 is turned on for time $t_1$ by applying a signal $\phi_{RS}$ 80 to the gate of transistor M3 70.

The signal $V_{IN}$ 10 is sampled for time $t_2$ by switching transistor M2 40 on, allowing current to integrate onto capacitor $C_1$ 50. The output signal $V_{OUT}$ increases until the source potential of transistor M1 20 rises to within approximately one threshold voltage from the first electrical signal $V_{IN}$ 10. At this point the sub-threshold behavior of the first transistor M1 20 determines the circuit behavior.

The first electrical signal $V_{IN}$ 10 is then sampled N-1 additional times, providing a final output after the Nth sample where N is any positive integer. The final output voltage $V_{OUT}$ 60 is representative of the average of the N samples. Following reinitialization by resetting output signal $V_{OUT}$ 60, the above procedure can be repeated.

The circuit of the FIG. 1 responds to small signals and functions as a peak detector. The circuit of the invention differs from prior art peak detectors because it averages small signals as well as behaves as a peak detector. The invention for smaller signals, averages, close to the optimum. The circuit of the invention is particularly useful for making long wave length focal plane arrays where there is a huge mismatch between the amount of current that the electronics has to deal with and the space available to do it in. The space factors are about 1000 to 1. The amount of current you can reasonably handle per unit area of silicon is about 1/1000 of what actually is coming in with prior art methods.

The circuit of FIG. 1 is capable of averaging around 100 pulses after which the voltage on C1 50 after 100 cycles is within 10% or so of being the true average of all the input voltages over the true average of all 100 input voltages.

Figure 3:
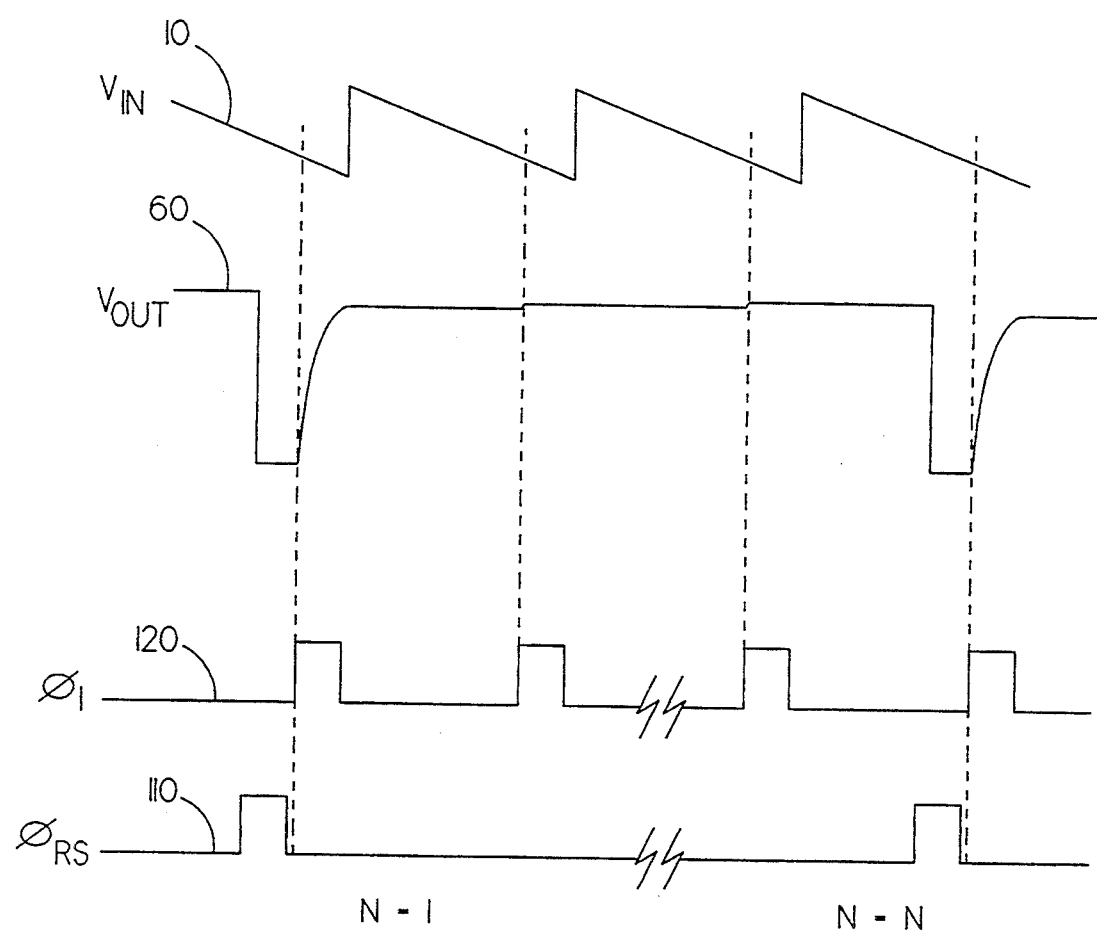
FIG. 3 is a signal level diagram showing the relationship between signals of the invention.

Transistor M2 40 acts like a switch and enables the peak detector. In the circuit of FIG. 1 the problem is typically that the signal is a function of time that starts out very small and grows bigger. So that if the peak detector is not disabled it will always tend to be the smallest signal; which is essentially zero. So the circuit needs to be disabled. The invention effectively isolates the pixel capacitor out of the circuit so it cannot charge capacitor C1 50. If $\phi_1$ is turned off then C1 50 cannot charge, no matter what voltage $V_{IN}$ is at. Transistor M3 70 resets the circuit of FIG. 1 by discharging everything. FIG. 3 shows the sampling behavior of the circuit of FIG. 1. $V_{OUT}$ 60 is shown integrating to the signal peak as the sampling $\phi_1$ 30 turns on transistor M2 40.

Figure 4:
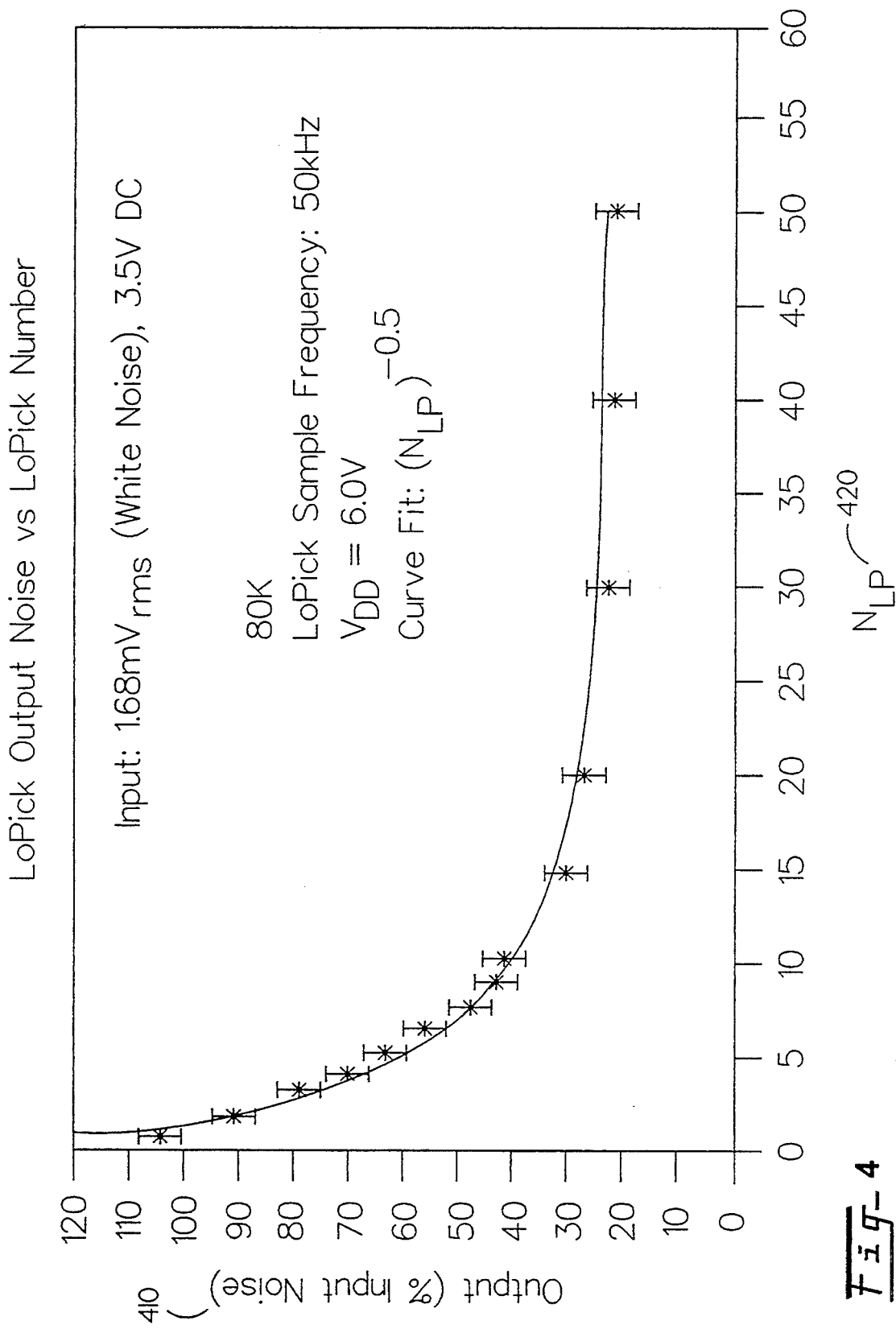
FIG. 4 is a diagram of the relationship of the noise versus samples.

Small signal circuit behavior is shown in FIG. 4 where the output RMS noise 410, as a function of the number of averages, is plotted as a percentage of the input RMS noise 420. As expected for an averager, the noise decreases proportionately to the square root of N.

Figure 5:
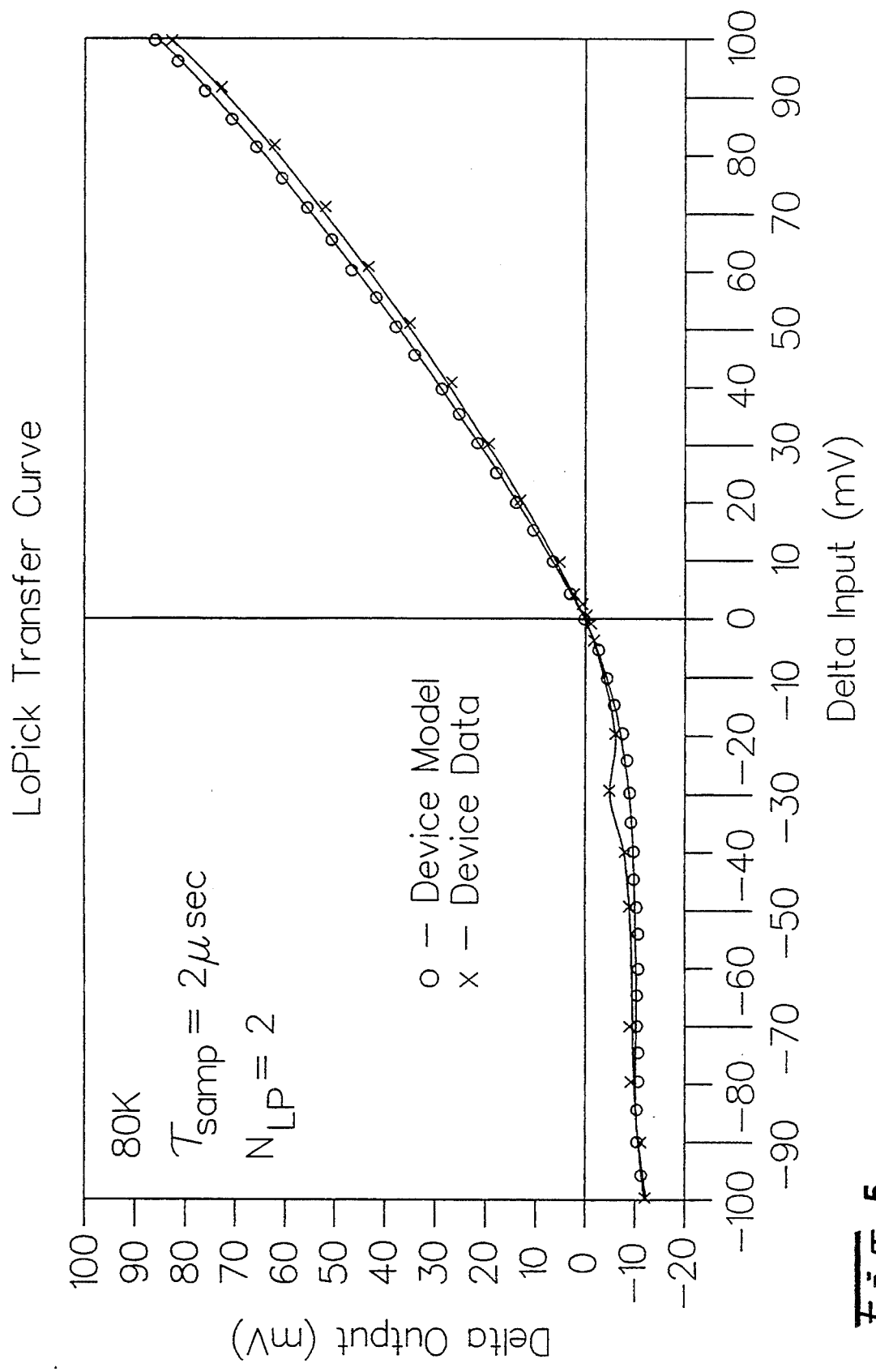
FIG. 5 shows a diagram showing the phase relationship between signals of the invention.

When the first electrical signal $V_{IN}$ 10 is a constant signal with guassian noise distribution with negative unipolar transient voltage shifts, operation is similar to that described above with the exception that the circuit responds as a peak detector. The circuit suppresses the noise associated with signals which are corrupted with negative polarity gamma or other unipolar transient voltage shifts. A differential transfer curve depicting this behavior is shown in FIG. 5. Response to guassian noise is the same as in FIG. 5.

The invention has several advantages over past applications. First, it performs two tasks, signal averaging and gamma or transient suppression, using a single, compact circuit. For averaging applications, the invention requires fewer and smaller components than past circuits performing similar functions. For example, using the same CMOS process, a typical signal averager designed for 64 averages would require approximately 50 times the area, most of which is needed for capacitors. This reduction in size allows for a significant reduction in silicon die area, applications which once required two silicon die can now be accomplished with a single die.

For the present invention of FIG. 1, the number of averages, N, which can be performed is not limited by the circuit configuration; N is continuously variable from one to approximately 200. Due to dynamic range considerations, other averaging circuitry must be designed for a specific number of averages, usually limited to less than 100. Moreover, the area required for other circuitry is directly proportional to the desired number of averages, while the present circuit remains at a constant, compact size.

FIG. 6 shows an embodiment of the invention used for gamma suppression applications in staring infrared focal planes, such as staring infrared focal plane 5 this circuit can be placed within the unit cell 6 of the multiplexer circuit, allowing suppression to occur immediately after the transimpedance stage of the readout circuitry. The invention provides a single readout circuit which eliminates the need for additional signal processing of focal plane information. As a result, system complexity and cost are all reduced while circuit simplicity is enhanced. Prior art implementations require more complex circuitry with greater silicon real estate and power requirements.

FIG. 6 shows the invention providing a peak detector utilizing a discrete sample and hold circuit prior to transistor M1 390 rather than using transistor M2 312 as a sampling switch. This approach is superior to the prior art since it employs $C_1$ 350 for both the sample and hold and integration functions, reducing circuit complexity.

In the circuit of FIG. 6, original function of transistor M2 40 shown in FIG. 1 is omitted and the signal 310 is sampled explicitly prior to the input transistor, M1 390. Operation is the same as described for the circuit of FIG. 1, however, the current through M1 is not discretely shut off.

Referring now to FIG. 7, an alternate embodiment of the invention is shown which holds an inverted signal/transient polarity. For signals of opposite polarity of those described above, the circuit in FIG. 1 can be implemented in its complementary form shown in FIG. 7.

The circuit of the invention may be used in non-gamma/transient suppression applications. In focal plane applications where the suppression of transient signal corruption is not an issue, the circuit can be implemented as a peak detector with respect to the positive signal direction. This will allow averaging of the signal noise while also providing a novel on-focal plane target detection method for fast moving targets, i.e., across pixels at a rate faster than the time necessary for N samples.

From a signal that has been contaminated with a noise spike that is bigger than the other samples the invention prevents the spike from showing up on the output.

The reset rate of the detector is the sample rate of the pixel.

Signal $\phi_{RS}$ 80 occurs a little bit before $\phi_1$ 30. The signals are synchronous with each other but the reset occurs a little bit before the input reset. The current from the detectors can be either positive or negative which is reflected in FIG. 7 as an alternate embodiment of FIG. 1.

In one alternative application of the invention the circuit of the invention can be employed in the signal path between a detector and a multiplexer. Some detectors contain typically an array of 64×64 sensors or an array of 128×128 sensors. Each detector comprises a preamplifier and a capacitor which stores the signal from the sensor. The capacitor cannot typically be made large enough.

In general, the $V_{IN}$ 10 would come from the sensor capacitor. In one example embodiment of the invention the detectors are photodiodes. The current under sensor capacitor is integrated by the circuit of the invention to form an average value of the sensed signal over a time interval. The problem in the prior art is the size of the capacitor limits the time interval below an acceptable level. The peak detector allows the use of the circuit of the invention in a radiation environment where high energy pulses are prevalent. These circuits can also act like a particle detector and produce a huge current spike which increases the noise level of the whole system quite dramatically. The peak detector of the invention does not respond to these huge spikes.

Figure 8A:
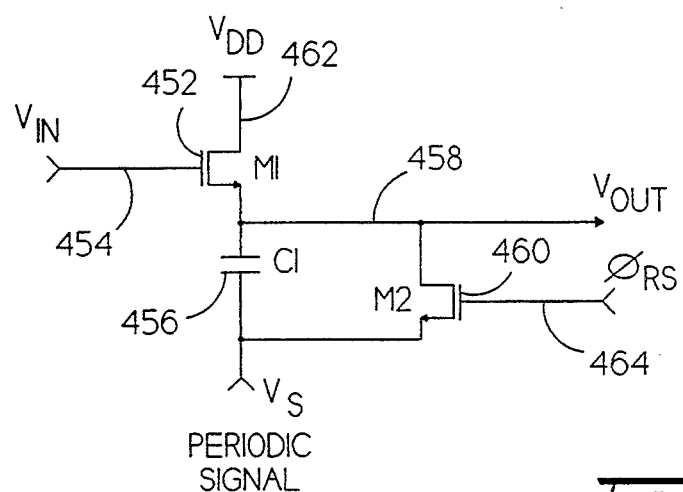
FIG. 8A shows a compact signal averager alternate embodiment.

Now referring to FIG. 8A which shows an embodiment of the compact signal averaging circuit of the apparatus of the invention. The signal averaging circuit of FIG. 8A employs a transistor and a capacitor in one configuration. The transistor M1 452 is provided with a gate control signal 454 which is connected to the voltage to be averaged. The transistor is also connected to a reference voltage (VDD) 462 and is also connected to capacitor C1 456. Reset transistor 460 discharges capacitor C1 456 in response to control line 464.

Figure 8B:
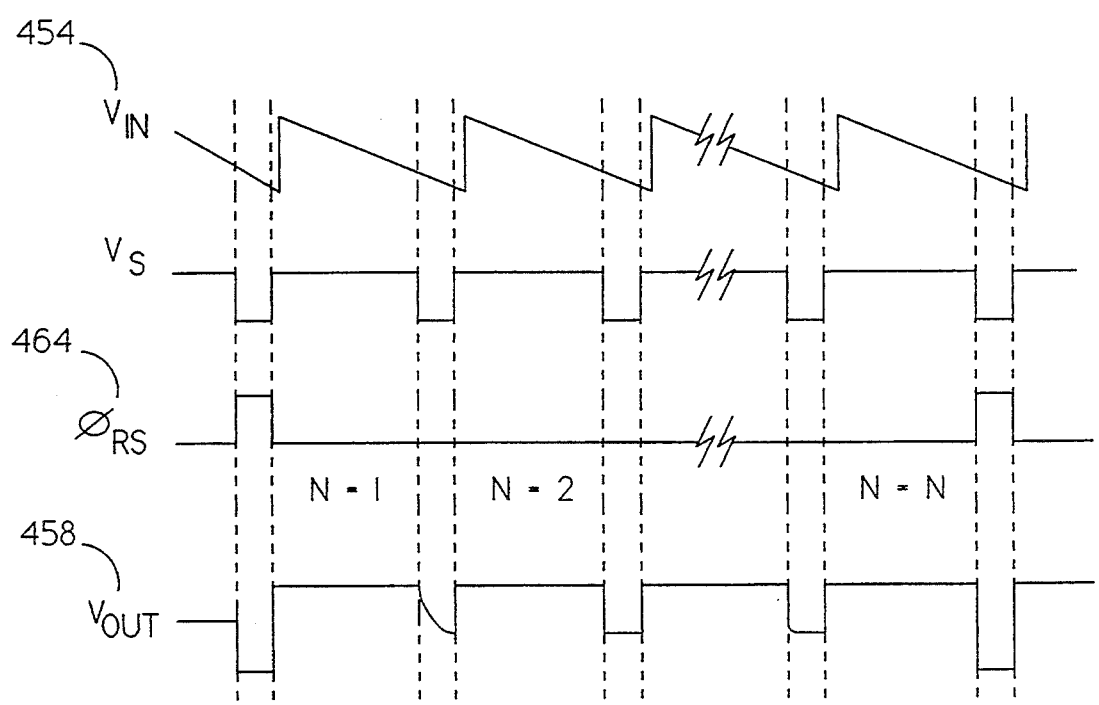
FIG. 8B shows the relationship of two control signals.

Now referring to FIG. 8B which shows the control reset signal 464 and the voltage in to be sampled 454 plotted as a function of time. FIG. 8B shows the periodic signal VS and the output voltage $V_{OUT}$ 458 which is integrating in capacitor C1 456 as each $V_{IN}$ sample integrates into capacitor C1 456.

Figure 9A:
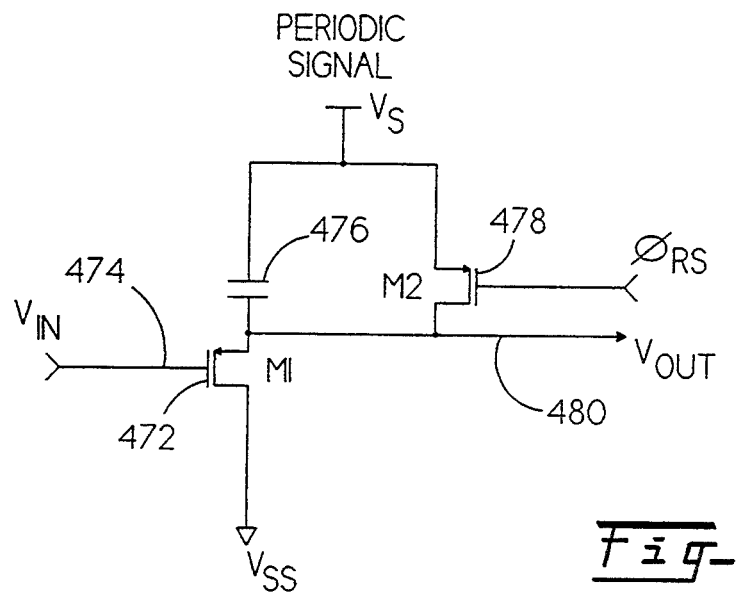
FIGS. 9A and 9B show a complementary version of one alternative embodiment of the invention.
Figure 9B:
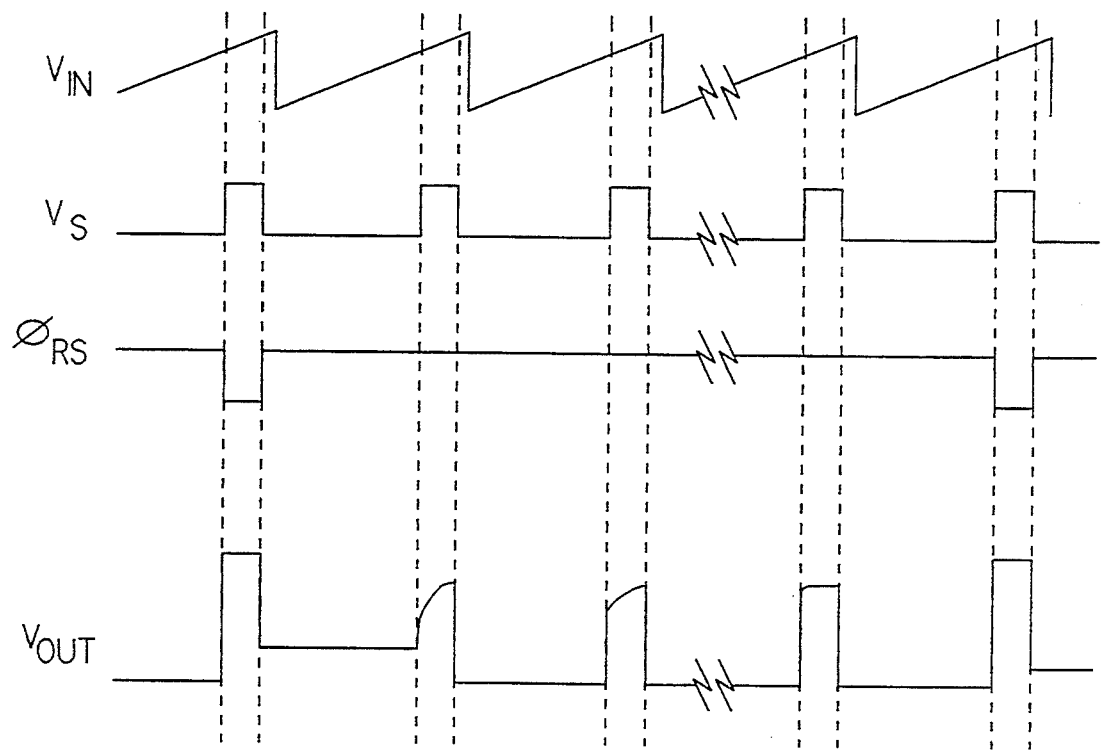

Now referring to FIG. 9 which shows the compact signal averaging circuit of the invention used to implement substantially the same signal averaging method of FIG. 8A except for the polarities are reversed. Capacitor 476 is charged in response to signal $V_{IN}$ applied to the gate of transistor 472 while reset signal $\phi_R$ maintains transistor 478 nonconducting. Signal $V_S$ effects sampling of the input signal $V_{IN}$. When reset signal $\phi_R$ applies a reset pulse to the gate of transistor 478, it operates to reset capacitor 476.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A signal averaging apparatus for averaging a sampled signal comprising:
   a) a first transistor having a gate, a first terminal and a second terminal, wherein the gate is coupled to receive an input signal;
   b) a capacitor having first and second terminals, wherein the first terminal is connected to the first terminal of the first transistor, and the second terminal of the capacitor is coupled to a periodic signal which operates the capacitor to average the input signal; and
   c) a second transistor having a gate, a first terminal and a second terminal, wherein the first terminal of the second transistor is coupled to the first terminal of the transistor, and the second terminal of the second transistor is coupled to the second terminal of the capacitor, and wherein the gate of the second transistor is coupled to receive a reset signal and where the second transistor operates in response to the reset signal to discharge the capacitor.

2. The signal averaging apparatus of claim 1, wherein the signal averaging apparatus operates to average any range of input signals.

3. The signal averaging apparatus of claim 1 further comprising an infrared focal plane array coupled to the first transistor wherein the infrared focal plane array provides the input signal.

* * * * *